US012019912B2

(12) United States Patent
Benjamin

(10) Patent No.: US 12,019,912 B2
(45) Date of Patent: Jun. 25, 2024

(54) CHANNELIZATION OF PSEUDO-RANDOM BINARY SEQUENCE GENERATORS

(71) Applicant: Micron Technology, Inc., Boise, ID (US)

(72) Inventor: Keith A. Benjamin, Blaine, MN (US)

(73) Assignee: Micron Technology, Inc., Boise, ID (US)

( * ) Notice: Subject to any disclaimer, the term of this patent is extended or adjusted under 35 U.S.C. 154(b) by 522 days.

(21) Appl. No.: 17/316,942

(22) Filed: May 11, 2021

(65) Prior Publication Data

US 2022/0365714 A1    Nov. 17, 2022

(51) Int. Cl.
*G06F 3/06* (2006.01)
*G06F 7/58* (2006.01)
*G11C 11/409* (2006.01)
*H03K 3/84* (2006.01)

(52) U.S. Cl.
CPC .......... *G06F 3/0659* (2013.01); *G06F 3/0604* (2013.01); *G06F 3/0679* (2013.01); *G06F 7/584* (2013.01); *H03K 3/84* (2013.01); *G11C 11/409* (2013.01)

(58) Field of Classification Search
CPC ....... H03K 3/84; G06F 3/0659; G06F 3/0604; G06F 3/0679; G06F 7/584; G11C 11/409
See application file for complete search history.

(56) References Cited

U.S. PATENT DOCUMENTS

2013/0055039 A1    2/2013   Dearth
2021/0405972 A1*  12/2021   McLean ................... H03K 3/84

OTHER PUBLICATIONS

Chen, et al., A Low-Power Highly Multiplexed Parallel PRBS Generator, IEEE Article, 2012, 978-1-4673-1556-2/12, 4 pages.

* cited by examiner

*Primary Examiner* — Elton Williams
(74) *Attorney, Agent, or Firm* — Brooks, Cameron & Huebsch, PLLC

(57) ABSTRACT

An example embodiment includes an n-bit parallel pseudo-random binary sequence (PRBS) generator coupled to channelization circuitry to control the channelization circuitry to select from among a single channel n-bit output pattern from the PRBS generator and a number of multiple channel output patterns from the PRBS generator. The number of multiple channel output patterns can correspond to respective sub-patterns of the single channel n-bit output pattern.

18 Claims, 6 Drawing Sheets

CHANNELIZATION OF PSEUDO-RANDOM BINARY SEQUENCE GENERATORS

TECHNICAL FIELD

Embodiments of the disclosure relate generally to electronic systems, and more specifically, relate to channelization of pseudo-random binary sequence generators.

BACKGROUND

A memory sub-system can include one or more memory devices that store data. The memory devices can be, for example, non-volatile memory devices and volatile memory devices. In general, a host system can utilize a memory sub-system to store data at the memory devices and to retrieve data from the memory devices.

BRIEF DESCRIPTION OF THE DRAWINGS

The disclosure will be understood more fully from the detailed description given below and from the accompanying drawings of various embodiments of the disclosure. The drawings, however, should not be taken to limit the disclosure to the specific embodiments, but are for explanation and understanding only.

DETAILED DESCRIPTION

Aspects of the present disclosure are directed to channelization of pseudo-random binary sequence generators. A memory sub-system can be a storage device, a memory module, or a hybrid of a storage device and memory module. Examples of storage devices and memory modules are described below in conjunction with FIG. 1. In general, a host system can utilize a memory sub-system that includes one or more components, such as memory devices that store data. The host system can provide data to be stored at the memory sub-system and can request data to be retrieved from the memory sub-system.

Pseudo-random binary sequence (PRBS) generators are devices that can be used for communication channel characterization, noise immunity, and many other applications. Conventional PRBS generators are constructed to output either serial single-bit patterns (e.g., sequences) per clock cycle or multi-bit patterns per clock cycle. In various instances, multi-bit sequences can be constructed via parallel implementation of multiple single-bit PRBS generators. Providing multiple instances of single-bit PRBS generators has drawbacks such as increased PRBS area and/or circuitry complexity and increased power consumption. Alternatively, a PRBS generator can output multiple parallel output bits; however, the quantity of parallel output bits is limited by the degree of the underlying polynomial. For example, a PRBS7 generator can be constructed from a polynomial "p" where $p=x^7+x^6+1$ such that the PRBS7 generator is limited to producing 7-bits in parallel.

Aspects of the present disclosure address the above and other deficiencies by providing a PRBS generator component capable of selecting between a single parallel output channel or a number of multi-bit parallel output channels. For example, a single PRBS generator can be used to provide either a single-bit parallel output pattern, or one of a number of multiple multi-bit parallel output patterns. As further described below, the channelization techniques of the present disclosure can provide various benefits such as reducing implementation cost (e.g., by minimizing the total number of PRBS generators used to produce multiple channels), allowing for on demand selectivity of the quantity of generated channels, providing the ability to provide power noise reduction by utilizing slower clock speeds for a given bit-rate, and encouraging reusability due to the variable channel bit-rates which can be created from a single PRBS generator instantiation, among other benefits.

Figure 1:
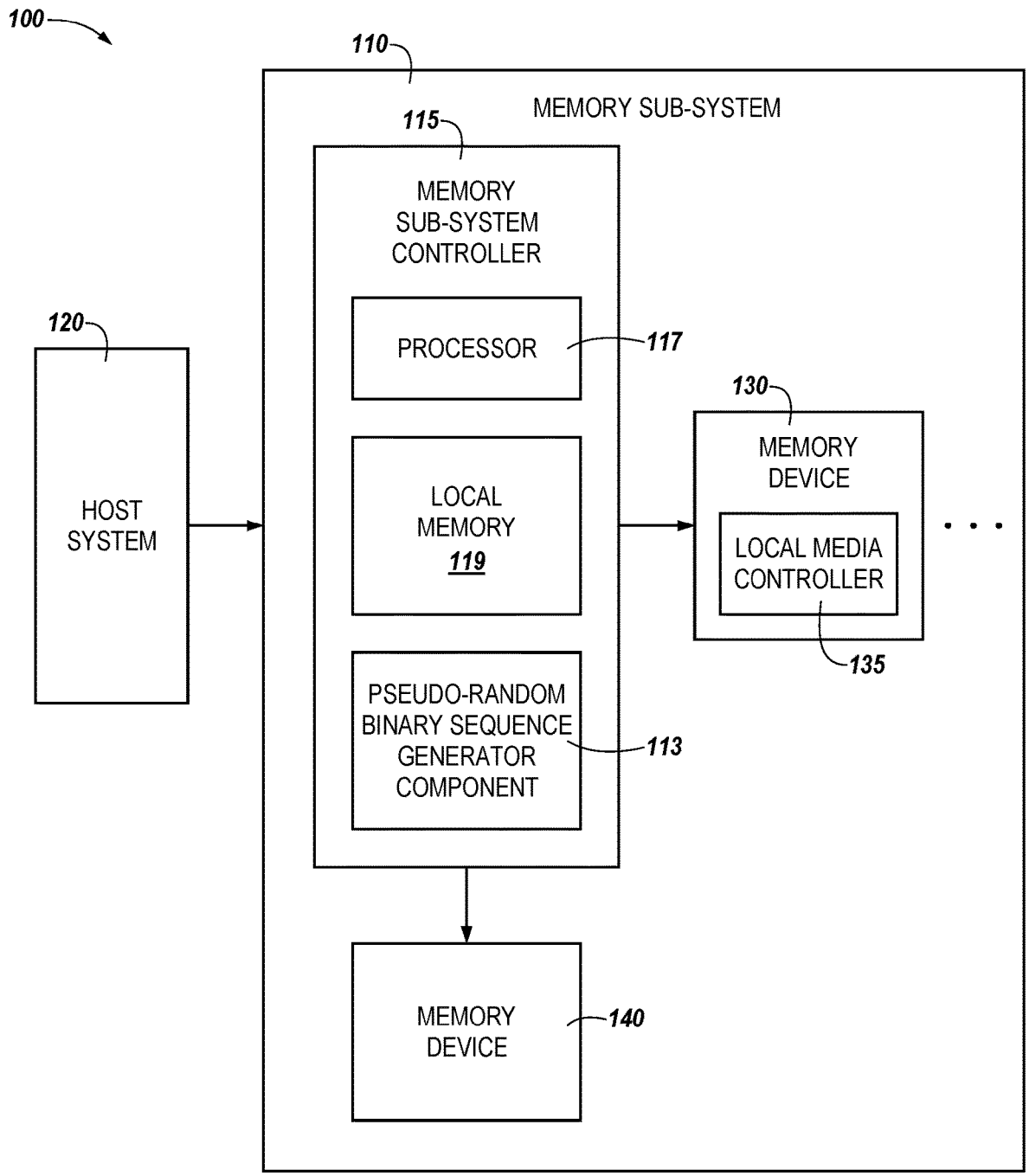
FIG. 1 illustrates an example computing environment that includes a memory sub-system having a pseudo-random binary sequence generator component in accordance with some embodiments of the present disclosure.

FIG. 1 illustrates an example computing environment 100 that includes a memory sub-system 110 in accordance with some embodiments of the present disclosure. The memory sub-system 110 can include media, such as one or more volatile memory devices (e.g., memory device 140), one or more non-volatile memory devices (e.g., memory device 130), or a combination of such.

A memory sub-system 110 can be a storage device, a memory module, or a hybrid of a storage device and memory module. Examples of a storage device include a solid-state drive (SSD), a flash drive, a universal serial bus (USB) flash drive, an embedded Multi-Media Controller (eMMC) drive, a Universal Flash Storage (UFS) drive, and a hard disk drive (HDD). Examples of memory modules include a dual in-line memory module (DIMM), a small outline DIMM (SO-DIMM), and a non-volatile dual in-line memory module (NVDIMM).

The computing environment 100 can include a host system 120 that is coupled to one or more memory sub-systems 110. In some embodiments, the host system 120 is coupled to different types of memory sub-system 110. FIG. 1 illustrates one example of a host system 120 coupled to one memory sub-system 110. The host system 120 uses the memory sub-system 110, for example, to write data to the memory sub-system 110 and read data from the memory sub-system 110. As used herein, "coupled to" generally refers to a connection between components, which can be an indirect communicative connection or direct communicative connection (e.g., without intervening components), whether wired or wireless, including connections such as electrical, optical, magnetic, etc.

The host system 120 can be a computing device such as a desktop computer, laptop computer, server, network server, mobile device, a vehicle (e.g., airplane, drone, train, automobile, or other conveyance), Internet of Things (IoT) enabled device, embedded computer (e.g., one included in a vehicle, industrial equipment, or a networked commercial device), or such computing device that includes a memory and a processing device. The host system 120 can be coupled to the memory sub-system 110 via a physical host interface. Examples of a physical host interface include, but are not limited to, a serial advanced technology attachment (SATA) interface, a peripheral component interconnect express (PCIe) interface, universal serial bus (USB) interface, Fibre Channel, Serial Attached SCSI (SAS), etc. The physical host interface can be used to transmit data between the host system 120 and the memory sub-system 110. The host system 120 can further utilize an NVM Express (NVMe) interface to access the memory components (e.g., memory devices 130) when the memory sub-system 110 is coupled with the host system 120 by the PCIe interface. The physical host interface can provide an interface for passing control, address, data, and other signals between the memory sub-system 110 and the host system 120.

The memory devices can include any combination of the different types of non-volatile memory devices and/or volatile memory devices. The volatile memory devices (e.g., memory device 140) can be, but are not limited to, random access memory (RAM), such as dynamic random access memory (DRAM) and synchronous dynamic random access memory (SDRAM).

An example of non-volatile memory devices (e.g., memory device 130) includes a negative-and (NAND) type flash memory. Each of the memory devices 130 can include one or more arrays of memory cells. The memory cells can include single level cells (SLCs) that can store one bit per cell, multi-level cells (MLCs) that can store two bits per cell, triple level cells (TLCs) that can store three bits per cell, quad-level cells (QLCs) that can store four bits per cell, and/or penta-level cells (PLCs) that can store five bits per cell, among others.

Although non-volatile memory components such as NAND type flash memory are described, the memory device 130 can be based on any other type of non-volatile memory. Example non-volatile memory types include read-only memory (ROM), phase change memory (PCM), magneto random access memory (MRAM), negative-or (NOR) flash memory, electrically erasable programmable read-only memory (EEPROM), and a cross-point array of non-volatile memory cells. A cross-point array of non-volatile memory can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased.

The memory sub-system controller 115 can communicate with the memory devices 130 to perform operations such as reading data, writing data, or erasing data at the memory devices 130 and other such operations. The memory sub-system controller 115 can include hardware such as one or more integrated circuits and/or discrete components, a buffer memory, or a combination thereof. The memory sub-system controller 115 can be a microcontroller, special purpose logic circuitry (e.g., a field programmable gate array (FPGA), an application specific integrated circuit (ASIC), etc.), or other suitable processor.

The memory sub-system controller 115 can be a processing device, which includes one or more processors (e.g., processor 117) configured to execute instructions stored in local memory 119. In the illustrated example, the local memory 119 of the memory sub-system controller 115 includes an embedded memory configured to store instructions for performing various processes, operations, logic flows, and routines that control operation of the memory sub-system 110, including handling communications between the memory sub-system 110 and the host system 120.

In some embodiments, the local memory 119 can include memory registers storing memory pointers, fetched data, etc. The local memory 119 can also include read-only memory (ROM) for storing micro-code. While the example memory sub-system 110 in FIG. 1 has been illustrated as including the memory sub-system controller 115, in another embodiment of the present disclosure, a memory sub-system 110 may not include a memory sub-system controller 115, and may instead rely upon external control (e.g., provided by an external host, or by a processor or controller separate from the memory sub-system).

In general, the memory sub-system controller 115 can receive commands or operations from the host system 120 and can convert the commands or operations into instructions or appropriate commands to achieve the desired access to the memory devices 130/140. The memory sub-system controller 115 can be responsible for other operations such as wear leveling operations, garbage collection operations, error detection and error-correcting code (ECC) operations, encryption operations, caching operations, and address translations between a logical block address and a physical block address that are associated with the memory devices 130/140. The memory sub-system controller 115 can further include host interface circuitry to communicate with the host system 120 via the physical host interface. The host interface circuitry can convert the commands received from the host system into command instructions to access the memory devices 130/140 as well as convert responses associated with the memory devices 130/140 into information for the host system 120.

The memory sub-system 110 can also include additional circuitry or components that are not illustrated. In some embodiments, the memory sub-system 110 can include a cache or buffer (e.g., DRAM) and address circuitry (e.g., a row decoder and a column decoder) that can receive an address from the memory sub-system controller 115 and decode the address to access the memory devices 130/140. In some embodiments, the memory devices 130/140 include local media controllers (e.g., local media controller 135) that operate in conjunction with memory sub-system controller 115 to execute operations on one or more memory cells of the memory devices 130/140.

In the example shown in FIG. 1, the memory sub-system 110 includes a PRBS generator component 113. The PRBS generator component 113 can include channelization circuitry (e.g., channelization circuitry 270 described in FIG. 2) used to select from among a single channel n-bit output pattern created by a pseudo-random binary sequence generator or a number of multiple channel output patterns from the pseudo-random binary sequence generator. In some embodiments, the memory sub-system controller 115 includes at least a portion of the pseudo-random binary sequence generator component 113. For example, the memory sub-system controller 115 can include a processor 117 (processing device) configured to execute instructions stored in local memory 119 for performing the operations described herein. In some embodiments, the pseudo-random binary sequence generator component 113 is part of the host system 110, an application, or an operating system.

In various embodiments, the output of the PRBS generator component (e.g., 113) can be provided to a receiver component (e.g., a memory component) for various purposes. Example purposes include interface testing (e.g., for data and/or control signal training), communication channel characterization, noise immunity, etc. As an example, the processing device (e.g., processor 117) can control the channelization circuitry to provide the single channel n-bit output pattern from the PRBS generator or the one of the multiple channel output patterns from the PRBS generator, whichever is selected, to a memory component (e.g., memory device 130, 140).

Figure 2:
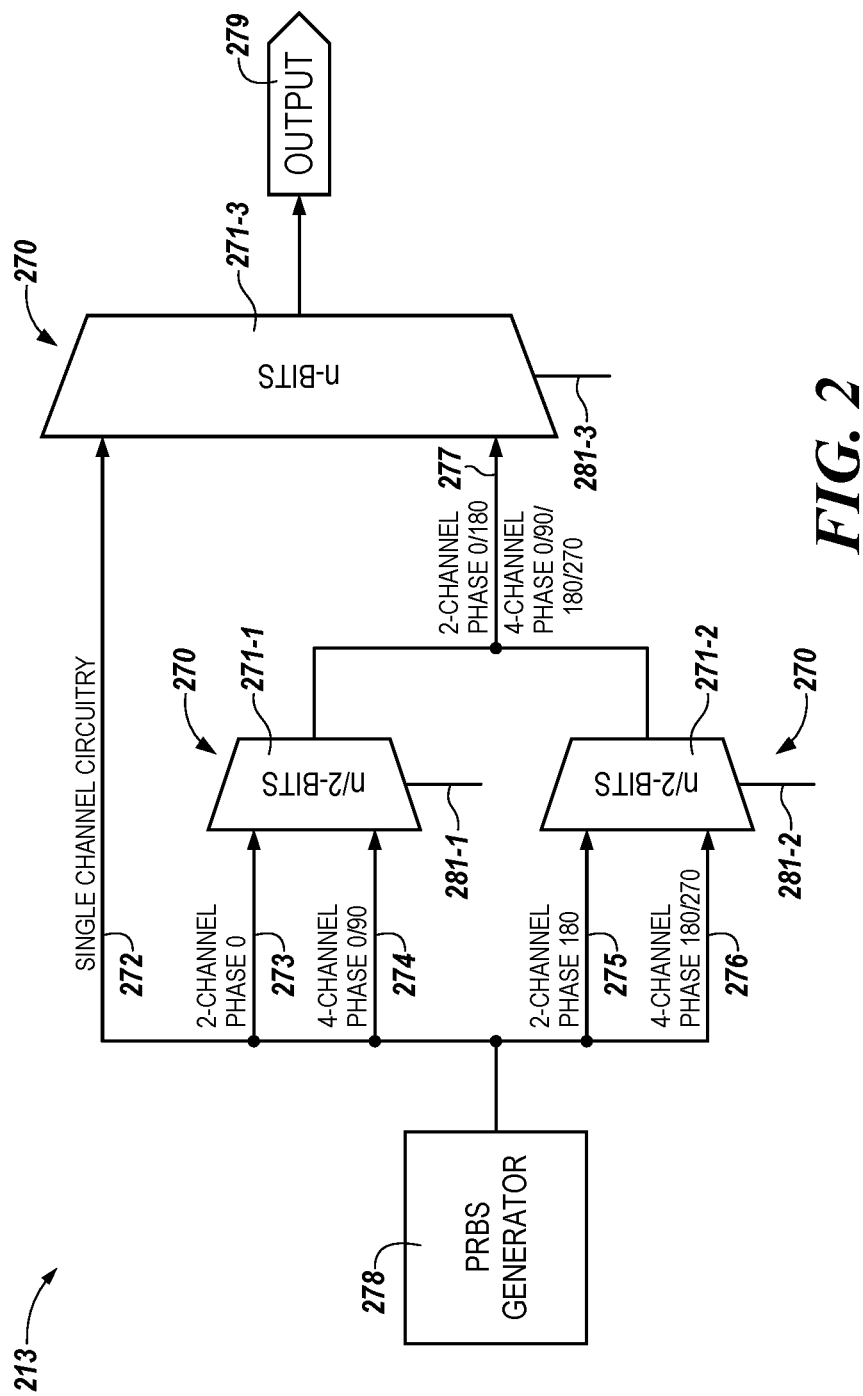
FIG. 2 illustrates an example pseudo-random binary sequence generator component in accordance with some embodiments of the present disclosure.

FIG. 2 illustrates an example pseudo-random binary sequence generator component 213 in accordance with some embodiments of the present disclosure. In some embodiments, the pseudo-random binary sequence generator component 213 can include a pseudo-random binary sequence (PRBS) generator 278 and a channelization circuitry 270. The PRBS generator 278 can include a linear feedback shift register (LFSR) having a particular feedback configuration. In some embodiments, the pseudo-random binary sequence generator 278 is an n-bit parallel pseudo-random binary sequence generator. In some embodiments, the pseudo-random binary sequence 278 can be a single generator as opposed to parallel instantiations of multiple single-bit generators.

In some embodiments, an n-bit parallel pseudo-random binary sequence generator 278 and the channelization circuitry 270 can be controlled via external signals, such as from a processor (e.g., processor 117 in FIG. 1). Further, the parallel PRBS generator can be used to select between a single channel n-bit output pattern or a number of multiple channel output patterns. In some embodiments, the parallel PRBS generator 278 can output an n-bit pattern and multiplexers 271-1, 271-2, 271-3 can be controlled to channelize the output of the PRBS generator 278. select a number of multiple channel output patterns by extending the number of states in the characteristic transition matrix to meet or exceed the number of output patterns desired. The transition matrix can be determined for generating an m-way parallel PRBS pattern of 2n−1. Following that, when m>n, the cost can increase with m significantly. For the case of m≤n, as m is smaller or equal to n, n-bits (therefore n D flip-flops (DFFs)) can be used to generate the data for the next cycle. If the data is represented in the DFFs in an array form of $D_k$, where $D_k=[D_{-1}\ D_{-2}\ \ldots\ D_{-n}]^T$, then, the transition matrix T can characterize the relationship between the next state $D_{k+1}$ and $D_k$ by:

$$D_{k+1}=T*D_k \quad (1)$$

where $D_{k+1}=[D_0\ D_{-1}\ \ldots\ D_{-n+1}]^T$. Then, the T matrix can be determined by mapping it from series PRBS generator using LFSR. The first row of Tis mapped from the XOR which corresponds to the characteristic polynomial $p=1+x^6+x^7$. The remaining rows of T form an identical matrix with an additional column appended with zeros. This matrix corresponds to the connection between each DFF.

For parallel PRBS generator with level of multiplexing m, for each cycle the circuit must step through m steps of the equivalent LFSR. Therefore, at next cycle, the outputs of DFFs should be $D_{k+m}$, where $D_{k+m}=[D_{m-1}\ D_{m-2}\ \ldots\ D_0]^T$. As an example:

$$T = \begin{matrix} 0 & 0 & 0 & 0 & 0 & 1 & 1 \\ 1 & 0 & 0 & 0 & 0 & 0 & 0 \\ 0 & 1 & 0 & 0 & 0 & 0 & 0 \\ 0 & 0 & 1 & 0 & 0 & 0 & 0 \\ 0 & 0 & 0 & 1 & 0 & 0 & 0 \\ 0 & 0 & 0 & 0 & 1 & 0 & 0 \\ 0 & 0 & 0 & 0 & 0 & 1 & 0 \end{matrix}$$

-continued $$T_p = \begin{matrix} 0 & 0 & 1 & 1 & 0 & 0 & 0 \\ 0 & 0 & 0 & 1 & 1 & 0 & 0 \\ 0 & 0 & 0 & 0 & 1 & 1 & 0 \\ 0 & 0 & 0 & 0 & 0 & 1 & 1 \\ 1 & 0 & 0 & 0 & 0 & 0 & 0 \\ 0 & 1 & 0 & 0 & 0 & 0 & 0 \\ 0 & 0 & 1 & 0 & 0 & 0 & 0 \end{matrix}$$

Based on equation (1), a parallel transition matrix Tp can be created to characterize the circuit:

$$D_{k+m}=T_p*D_k=T_m*D_k, \quad (2)$$

where Tp=Tm. After calculating $T_p$ by matrix multiplications, it can be transformed into an equivalent circuit. One example $T_p$ for generating PRBS pattern of $2^7-1$ with m=4 is shown above. As is shown, after translated into circuits, an implementation is obtained that consists of 4 XORs and has a maximum fan-out of 2. Further, m XORs and a maximum fan-out of 2 can be achieved under all cases of m≤n. For values of m>n, the procedure may no longer offer similar results. In some examples, since m is larger than n, the number of DFF is limited by m instead of n. Therefore, T and $T_p$ are both of size m×m instead of n×n. Moreover, the number of ones in the matrix increases, implying an increasing number of XOR. Finally, the distribution is non-uniform. It can be seen that all the ones are concentrated between the first seven columns while the others are filled with zeros. This indicates high fan-out for the first seven DFFs but zero fan-out for the others. For example, a 16-bit PRBS7 generator requires m=16, resulting in an implementation with 23 XORs and fan-out of 6.

Examples of selectable single channel output or multiple channel outputs are described further in association with FIGS. 3A-3B below. In some embodiments, the number of multiple channel output patterns are sub-patterns to a single channel n-bit output pattern. That is, the number of multiple channel output patterns can be different sections of a single channel n-bit output pattern. In some embodiments, if one of the number of multiple channel output patterns is selected, each sub-pattern can include fewer than n bits, and each sub-pattern can match a sequential portion of the n-bit output pattern from the PRBS generator. Further, in some embodiments, the selected one of the number of multiple channel output patterns can be a 2-channel output pattern, with a first channel including every odd bit of the n-bit output pattern from the PRBS generator and a second channel including every even bit of the n-bit output pattern from the PRBS generator. In some embodiments, the one of the number of multiple channel output patterns can include 2^m output channels, where "m" is 1 or greater. It is also noted that m=0 is a valid solution, where the number of channels/phases would be one. In addition, every 2^m bit of the n-bit output pattern can be provided to a multiplexor for output at n/(2^m) bits per phase. The quantity of phases corresponding to the 2^m output channels can be 2^m phases.

In some embodiments, the number of multiple channel output patterns can correspond to respective sub-patterns of the single channel n-bit output pattern. In some embodiments, the one of the number of multiple channel output patterns can be selected based on a target output bit rate that is less than a bit rate corresponding to the single channel n-bit output pattern. In some embodiments, an n-bit parallel PRBS generator can be the single source for the n-bit output pattern. The sub-patterns of the single channel n-bit output pattern can have different respective phase relationships.

Further details with regards to the operations of the pseudo-random binary sequence generator component 113 are described below.

For example, a single n-bit parallel pseudo-random binary sequence (PRBS) generator can provide an n-bit data pattern to channelization circuitry. The n-bit parallel pseudo-random binary sequence (PRBS) generator can select, via the channelization circuitry, from among a single channel n-bit output pattern from the PRBS generator and a number of multiple channel output patterns from the PRBS generator. In some embodiments, the number of multiple channel output patterns can correspond to respective sub-patterns of the single channel n-bit output pattern. The n-bit parallel pseudo-random binary sequence (PRBS) generator can provide the selected one of the single channel n-bit output pattern and the number of multiple channel output patterns to a receiver component. In some embodiments, the receiver component can be a memory component (e.g., memory device 130, 140) or any other various circuitry components. The memory device can be coupled to an output of the channelization circuitry. In some embodiments, the n-bit parallel pseudo-random binary sequence generator can start the data patterns of the number of multiple channel output patterns at different locations within the single channel n-bit output pattern. The sub-patterns of the single channel n-bit output pattern can be received from the PRBS generator.

The channelization circuitry can be configured to receive an n-bit pattern from the PRBS generator. In addition, the channelization circuitry, at the output of the channelization circuitry can selectively provide the n bits of an n-bit pattern received from the PRBS generator as a single channel n-bit output or as one of a number of multiple channel outputs with each one of the multiple channel outputs including n/m of the n bits, where "m" is the quantity of channels and is 2 or greater. In some embodiments, the number of multiple channel output patterns can correspond to respective sub-patterns of the single channel n-bit output pattern. In some embodiments, each one of the multiple channel outputs can be a sub-pattern of the n-bit pattern received from the PRBS generator. The sub-patterns of the n-bit pattern can have different respective phase relationships. In some embodiments, the first one of the multiple channel outputs can include a sub-pattern corresponding to every odd bit of the n-bit pattern received from the PRBS generator. In contrast, the second one of the multiple channel outputs can include a sub-pattern corresponding to every even bit of the n-bit pattern received from the PRBS generator.

In some embodiments, based on the desired output, the channelization circuitry 270 can be used to select a single channel output 272 to produce a single channel n-bit output pattern through the multiplexor 271-3. For example, when a single channel output 272 of the channelization circuitry 270 is selected, the n-bit output pattern from PRBS generator 278 is provided to, and output by, multiplexor 271-3 (e.g., at output 279). In some embodiments, one of a number of different multiple channel output patterns can be selected based on the n-bit output pattern generated by the PRBS generator 278. For example, based on a desired quantity of output channels, the channelization circuitry 270 can be used to select multiple phases to produce an output 279. The multiplexors 271-1, 271-2, 271-3 include respective selection pins 281-1, 281-2, 281-3 used to select the desired inputs (e.g., 272, 273, 274, 275, 276, 277).

For instance, if two channels are desired, the pseudo-random binary sequence generator 278 can send half of the bits through "2-Channel Phase 0" 273 of the channelization circuitry 270 to a first multiplexor 271-1 and the other half of the bits through "2-Channel Phase 180" 275 of the channelization circuitry 270 to a second multiplexor 271-2. The first multiplexor 271-1 and the second multiplexor 271-2 can then route the first half and the second half of the bits through "Phase 0/180" 277 to the third multiplexor 271-3 to produce an output 279.

In another example, if four channels are desired, the pseudo-random binary sequence generator 278 can send a first quarter of the bits through "2-Channel Phase 0" 273 of the channelization circuitry 270 to a first multiplexor 271-1, a second quarter of the bits through "2-Channel Phase 180" 275 of the channelization circuitry 270 to a second multiplexor 271-2, a third quarter of the bits through "4-Channel Phase 90" 274 of the channelization circuitry 270 to a first multiplexor 271-1, and a fourth quarter of the bits through "4-Channel Phase 180/270" 276 of the channelization circuitry 270 to a second multiplexor 271-2. The first multiplexor 271-1 and the second multiplexor 271-2 can then route the first, second, third and fourth portions of bits through "Phase 0/180" 277 to the third multiplexor 271-3 to produce an output 279. However, this disclosure is not so limited. As an example, the multiplexors 271-1, 271-2, 271-3 can be arranged such that bits output from PRBS generator 278 are routed through multiplexor 271-3 first and then through multiplexors 271-1 and 271-2. For example, the output of the PRBS generator 278 can be provided to multiplexor 271-3 with the output of multiplexor 271-3 being provided to the inputs of multiplexors 271-1 and 271-2.

As a further example, for a 2-Channel output from a 16-bit output from PRBS generator 278, multiplexer 271-1 selects half of the 16 bits (8 even bits corresponding to phase 0) and multiplexor 271-2 selects the other half of the 16 bits (8 odd bits corresponding to phase 180). For 4-Channel output from PRBS generator 278, multiplexor 271-1 selects 4 bits corresponding to phase 0 of the 16-bit output and 4 bits corresponding to phase 90 of the 16-bit output, while multiplexor 271-2 selects 4 bits corresponding to phase 180 of the 16-bit output and 4 bits corresponding to phase 270 of the 16-bit output. "2-Channel Phase 0" 273 and "2-Channel Phase 180" 275 each correspond to a first selected multiple channel output (i.e., a 2-Channel output), and "4-Channel Phase 0/90" 274 and "4-Channel Phase 180/270" 276 each correspond to a second selected multiple channel output (i.e., a 4-channel output). In this example, the input through "2-Channel Phase 0" 273 to multiplexor 271-1 corresponds to phase 0 of a selected 2-channel output and input through "2-Channel Phase 180" 275 to multiplexer 271-2 corresponds to phase 180 of the selected 2-channel output. Similarly, input through "4-Channel Phase 0/90" 274 to multiplexer 271-1 corresponds to phases 0 and 90 of a selected 4-channel output, etc.

In a number of embodiments, the quantity of channels capable of being selected based on the n-bit output pattern of the PRBS generator 278 can be increased by increasing the quantity of multiplexors (e.g., by a power of 2) corresponding to the channelization circuitry 270. For example, to provide an 8-channel output, an additional level of multiplexing (e.g., four additional multiplexors) could be added to the channelization circuitry 270. For the 8-channel example, the corresponding phases would be 0, 45, 90, 135, 180, 225, 270, and 315. As an example, the levels of the multiplexers 271-1, 271-2, 271-3 can be increased to increase the quantity of selectable channels rather than increasing the amount of phases. In some embodiments, the quantity of channels selected can be based on a target output bit rate (e.g., at output 279).

Figure 3A:
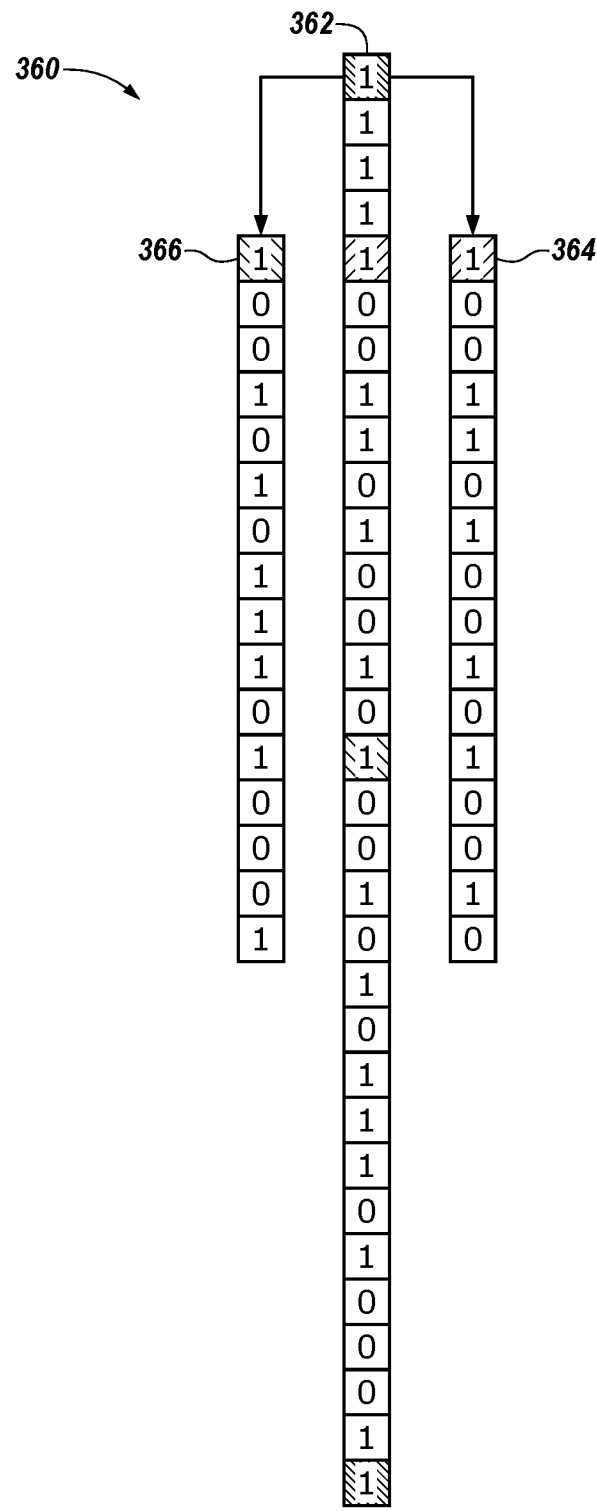
FIG. 3A illustrates example output patterns corresponding to respective channels of a PRBS generator component in accordance with some embodiments of the present disclosure.

FIG. 3A illustrates example output patterns corresponding to respective channels of a PRBS generator component in accordance with some embodiments of the present disclosure. Channel 362 represents an n-bit output pattern from a PRBS generator such as PRBS generator 278 described in FIG. 2. In this example, n=32. Channels 364 and 366 represent a selectable 2-channel output with each of the two channels comprising n/2 bits (e.g., 16 bits) of the n-bit output pattern (e.g., the 32-bit output pattern from the PRBS generator). In various embodiments, channelization circuitry (e.g., 270) can be used to select one of the single channel output corresponding to channel 362 or the 2-channel output corresponding to channels 364 and 366 to be output by a PRBS generator component in accordance with embodiments described herein (e.g., PRBS generator components 113, 213).

For example, as described in FIG. 2, the n-bit output pattern corresponding to single channel 362 can be divided into n/2-bit sub-patterns corresponding to respective channels 364, 366. For example, channel 364 can include a first n/2 bits of the single channel n-bit output pattern, and channel 366 can include a second (e.g., remaining) n/2 bits of the single channel n-bit output pattern. The n/2 bits of the first and second output patterns can each be a respective portion of sequential bits of the n-bit pattern corresponding to channel 362. For instance, as shown in FIG. 3A, a first bit of the sequence of bits corresponding to channel 364 corresponds to a fifth bit of the sequence of bits corresponding to channel 362, a second bit of the sequence of bits corresponding to channel 364 corresponds to a sixth bit of the sequence of bits corresponding to channel 362, etc. Similarly, a first bit of the sequence of bits corresponding to channel 366 corresponds to a sixteenth bit of the sequence of bits corresponding to channel 362, a second bit of the sequence of bits corresponding to channel 364 corresponds to a seventeenth bit of the sequence of bits corresponding to channel 362, etc. In some embodiments, as illustrated in FIG. 3A, the n/2 bits corresponding to respective channels 364, 366 can each begin at a different location (e.g., bit position) of the n-bit output pattern corresponding to the single channel 362.

Figure 3B:
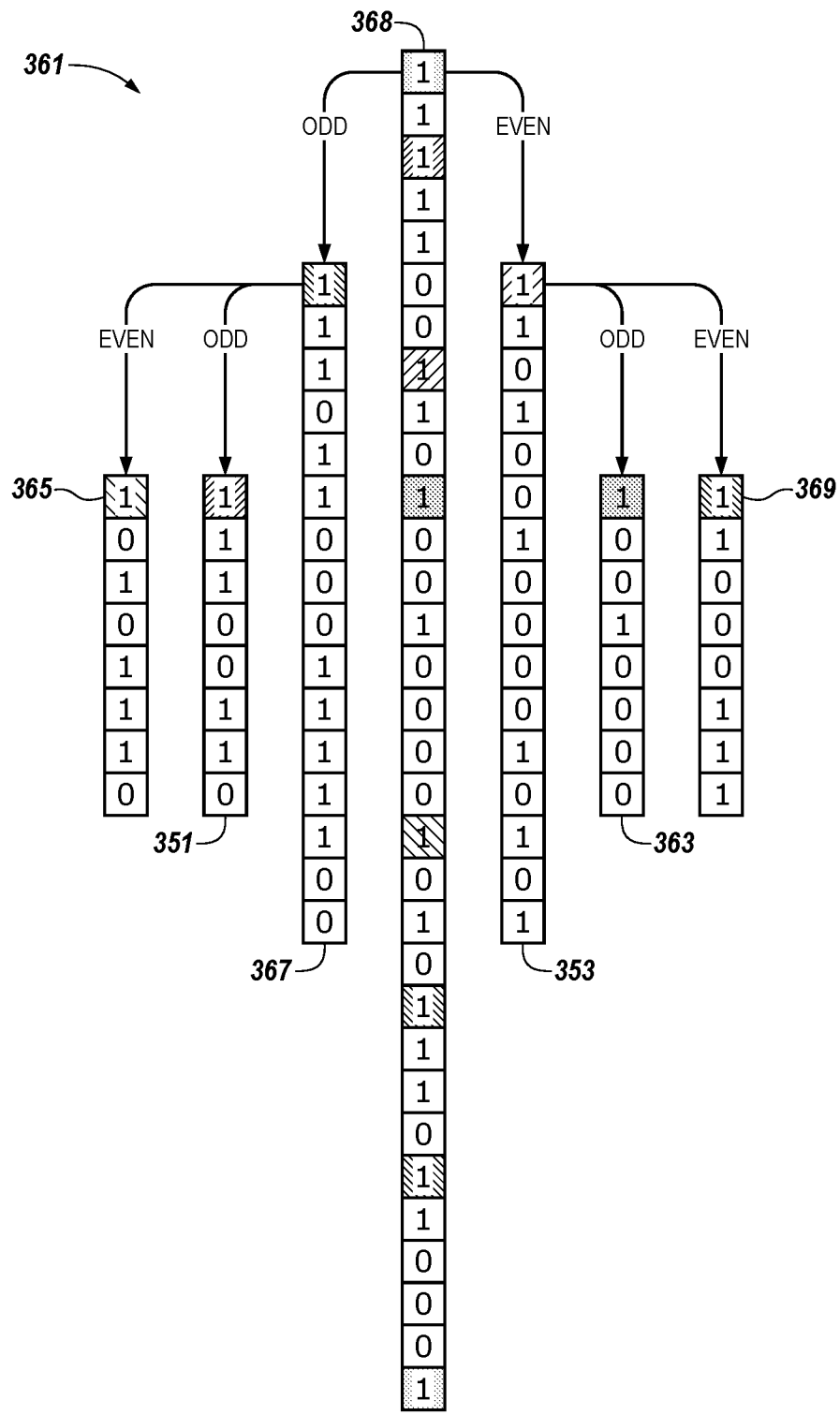
FIG. 3B illustrates example output patterns corresponding to respective channels of a PRBS generator component in accordance with some embodiments of the present disclosure.

FIG. 3B illustrates an example channel 361 of a pseudo-random binary sequence generator in accordance with some embodiments of the present disclosure. In some embodiments, the pseudo-random binary sequence generator can use the single channel 368 to produce a single channel n-bit output pattern by sending the single channel 368 through a channelization circuitry and to a multiplexor. That is, based on the desired output, a single channel 368 of the channel 361 can be selected and produce an output using a single channel channelization circuitry.

In some embodiments, the single channel 368 can be divided into sub-channels 351, 353, 363, 365, 367, 369 to produce sub-patterns of a single channel n-bit output pattern. That is, sub-channels 351, 353, 363, 365, 367, 369 can be portions of the single channel 368. In some embodiments, the sub-channels 351, 353, 363, 365, 367, 369 can be grouped into odd bits and even bits, where each sub-channel 351, 353, 363, 365, 367, 369 begins at a different location of the single channel 368. In some embodiments, the pseudo-random binary sequence generator can send every odd bits (e.g., sub-channels 351, 363, 367) or even bits (e.g., sub-channels 353, 365, 369) through the channelization circuitry and to the multiplexors to produce multiple channel output patterns, based on the desired output. However, this disclosure is not so limited. For example, in some embodiments, the pseudo-random binary sequence generator can send a variation of odd bits (e.g., sub-channels 351, 363, 367) and even bits (e.g., sub-channels 353, 365, 369) through the channelization circuitry and then to the multiplexors to produce multiple channel output patterns, based on the desired output.

In some embodiments, additional sub-channels can be created by further sub-dividing the single channel 368. For example, four channels can be created by sub-dividing the single channel 368 into four bits (e.g., sub-channels). That is, the pseudo-random binary sequence generator can create as many channels as desired, in increments of two, within a single channel 368. In addition, based on desired output, the pseudo-random binary sequence generator can select a single channel n-bit output pattern or a number of multiple channel output patterns.

Figure 4:
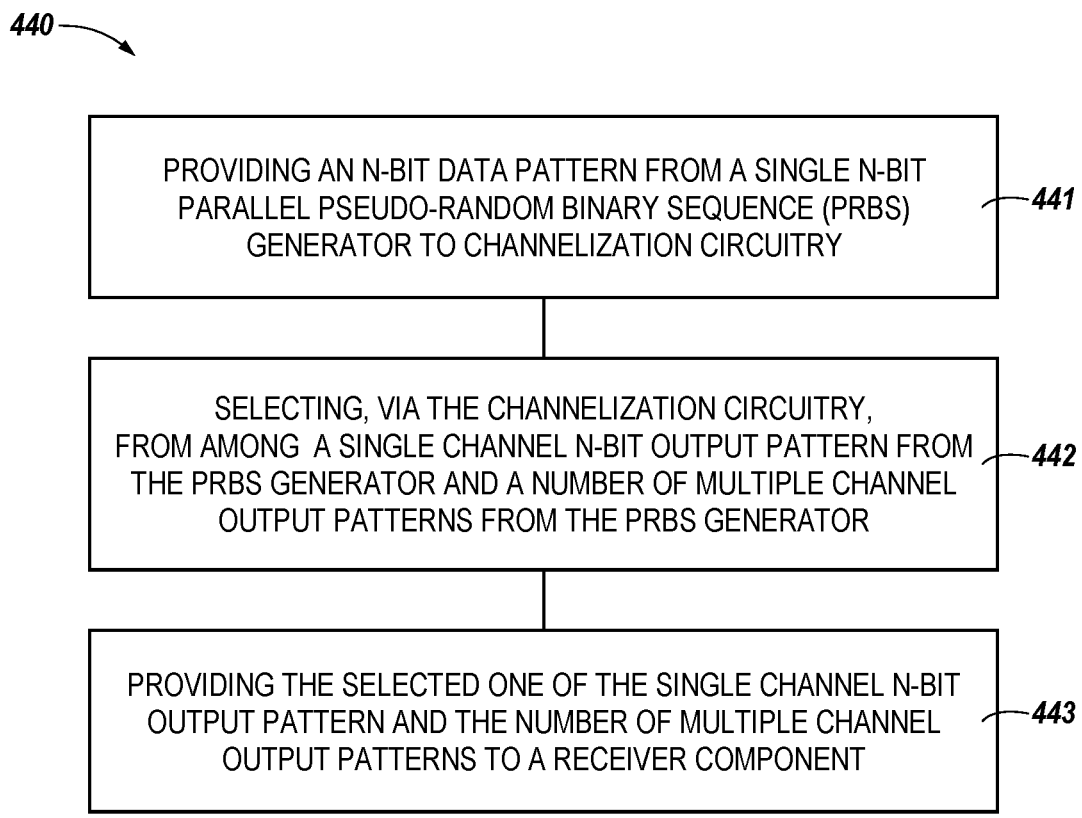
FIG. 4 is a flow diagram of an example method for channelization of PRBS generators in accordance with some embodiments of the present disclosure.

FIG. 4 is a flow diagram of an example method 440 for channelization of PRBS generators in accordance with some embodiments of the present disclosure. The method 440 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 440 is performed by the PRBS generator component 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 441, the processing device can provide an n-bit data pattern from a single n-bit parallel pseudo-random binary sequence (PRBS) generator to channelization circuitry. In some embodiments, the n-bit parallel pseudo-random binary sequence generator can send channel output patterns through the channelization circuitry to produce a channelized output. In some embodiments, the n-bit data pattern can be a single channel n-bit output pattern or a number of multiple channel output patterns. That is, the PRBS generator can produce a single channel n-bit output pattern to generate to send channel output patterns through the channelization circuitry. The single channel n-bit output pattern can be divided into sub-patterns to create a number of multiple channel output patterns. For example, as described herein, based on the desired outcome the PRBS generator can select between the single channel n-bit output pattern or one of a number of sub-patterns (e.g., a number of multiple channel output patterns).

At operation 442, the processing device can select, via the channelization circuitry, from among a single channel n-bit output pattern from the PRBS generator and a number of multiple channel output patterns from the PRBS generator. That is, based on the desired output, the PRBS generator can select between sub-patterns of a single channel n-bit output pattern or select the single channel n-bit output pattern. In some embodiments, the n-bit output pattern can be produced by using a transition matrix. The PRBS generator is able to channelize the n-bit output patterns by grouping the outputs into a single channel n-bit output pattern. For instance, the generation of multiple bits from a single PRBS generator is accomplished by extending the number of states in the characteristic transition matrix, to meet or exceed the number of output bits desired. This transition matrix is permuted when raised to the same power as the number of output bits desired. When provided to the channelization circuitry, the resultant transition matrix will yield output patterns which transition through n number of steps per clock cycle. For example, a PRBS generator with the characteristic polynomial $x_{n+1}=x_n^5+x_n^4$ yields the transition matrix "A":

$$A = \begin{bmatrix} p_{1\times 5} \\ I_4 \mid 0_{4\times 1} \end{bmatrix}$$

based on the linear equation $X_{n+1}=AX_n$ where X is the state vector, p=[0 0 0 1 1], $I_4$ is the rank-4 identity matrix, and $0_{4\times 1}$ is the zero vector to pad size discrepancies.

Each clock cycle will replace the value of X[1] with X[5] or X[4] and X[2:5] will be shifted into X[1:4]. In other words, after each clock cycle X[1] will be replaced with subsequent values of the PRBS generator pattern.

At operation 443, the processing device can provide the selected one of the single channel n-bit output pattern and the number of multiple channel output patterns to a receiver component. In some embodiments, the processing device can send the selected output pattern to a memory device (e.g., memory device 130, 140 of FIG. 1). The processing device can store the selected output pattern on the memory device. For example, the processing device can save the single channel n-bit output pattern to the memory device. In other embodiment, the processing device can save the number of multiple channel output patterns to the memory device or one of the number of multiple channel output patterns to the memory device.

Figure 5:
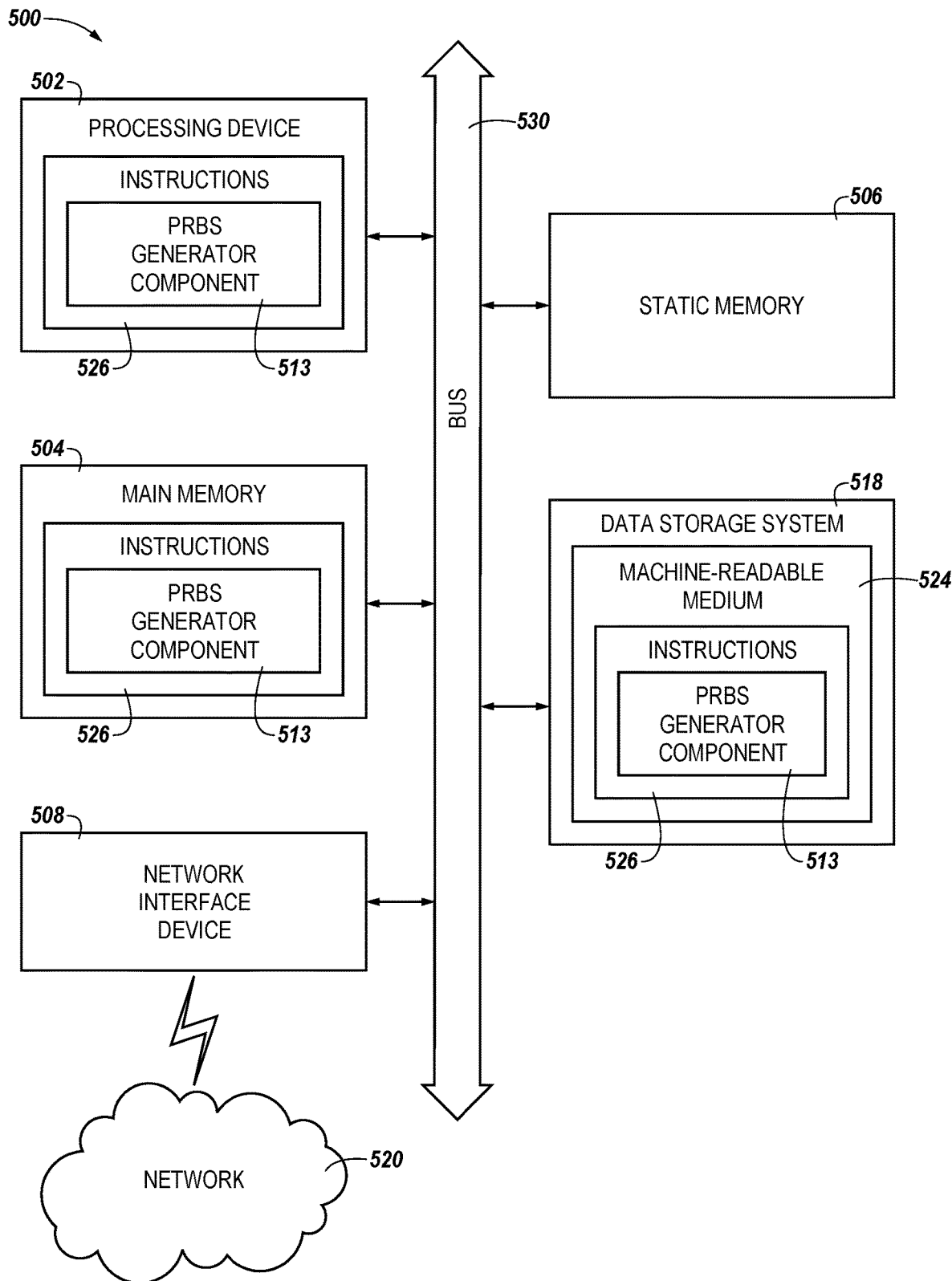
FIG. 5 is a block diagram of an example computer system in which embodiments of the present disclosure may operate.

FIG. 5 illustrates an example machine of a computer system 500 within which a set of instructions, for causing the machine to perform any one or more of the methodologies discussed herein, can be executed. In some embodiments, the computer system 500 can correspond to a host system (e.g., the host system 120 of FIG. 1) that includes, is coupled to, or utilizes a memory sub-system (e.g., the memory sub-system 110 of FIG. 1) or can be used to perform the operations of a controller (e.g., to execute an operating system to perform operations corresponding to the PRBS generator component 113 of FIG. 1). In alternative embodiments, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 500 includes a processing device 502, a main memory 504 (e.g., read-only memory (ROM), flash memory, dynamic random access memory (DRAM) such as synchronous DRAM (SDRAM) or RDRAM, etc.), a static memory 506 (e.g., flash memory, static random access memory (SRAM), etc.), and a data storage system 518, which communicate with each other via a bus 530.

Processing device 502 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 502 can also be one or more special-purpose processing devices such as an application specific integrated circuit (ASIC), a field programmable gate array (FPGA), a digital signal processor (DSP), network processor, or the like. The processing device 502 is configured to execute instructions 526 for performing the operations and steps discussed herein. The computer system 500 can further include a network interface device 508 to communicate over the network 520.

The data storage system 518 can include a machine-readable storage medium 524 (also known as a computer-readable medium) on which is stored one or more sets of instructions 526 or software embodying any one or more of the methodologies or functions described herein. The instructions 526 can also reside, completely or at least partially, within the main memory 504 and/or within the processing device 502 during execution thereof by the computer system 500, the main memory 504 and the processing device 502 also constituting machine-readable storage media. The machine-readable storage medium 524, data storage system 518, and/or main memory 504 can correspond to the memory sub-system 110 of FIG. 1.

In one embodiment, the instructions 526 include instructions to implement functionality corresponding to a PRBS generator component (e.g., the pseudo-random binary sequence generator component 113 of FIG. 1). While the machine-readable storage medium 524 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general purpose computer selectively activated or reconfigured by a computer program stored in the computer. Such a computer program can be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory components, etc.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. A system, comprising:
a memory component;
an n-bit parallel pseudo-random binary sequence (PRBS) generator coupled to channelization circuitry; and
a processing device, operatively coupled with the memory component, to:
control the channelization circuitry to select from among a single channel n-bit output pattern from the PRBS generator and a number of multiple channel output patterns from the PRBS generator, wherein:
the number of multiple channel output patterns correspond to respective sub-patterns of the single channel n-bit output pattern; and
one of the number of multiple channel output patterns is selected based on a target output bit rate that is less than a bit rate corresponding to the single channel n-bit output pattern.

2. The system of claim 1, wherein the processing device controls the channelization circuitry to provide a selected one of the single channel n-bit output pattern from the PRBS generator or the one of the multiple channel output patterns from the PRBS generator to the memory component.

3. The system of claim 2, wherein the memory component is a non-volatile memory device.

4. The system of claim 1, wherein the n-bit parallel PRBS generator is a single source for the n-bit output pattern.

5. The system of claim 1, wherein the sub-patterns of the single channel n-bit output pattern have different respective phase relationships.

6. The system of claim 1, wherein the one of the number of multiple channel output patterns comprises $2^m$ output channels, wherein "m" is 1 or greater, and wherein every $2^m$ bit of the n-bit output pattern is provided to a multiplexer for output at $n/(2^m)$ bits per phase, and wherein a quantity of phases corresponding to the $2^m$ output channels comprises $2^m$ phases.

7. The system of claim 1, wherein for the selected one of the number of multiple channel output patterns, each sub-pattern comprises fewer than n bits, and each sub-pattern matches a sequential portion of the n-bit output pattern from the PRBS generator.

8. The system of claim 1, wherein the selected one of the number of multiple channel output patterns is a 2-channel output pattern, with a first channel comprising every odd bit of the n-bit output pattern from the PRBS generator and a second channel comprising every even bit of the n-bit output pattern from the PRBS generator.

9. A method, comprising:
providing an n-bit data pattern from a single n-bit parallel pseudo-random binary sequence (PRBS) generator to channelization circuitry;
selecting, via the channelization circuitry, from among a single channel n-bit output pattern from the PRBS generator and a number of multiple channel output patterns from the PRBS generator, wherein:
the number of multiple channel output patterns correspond to respective sub-patterns of the single channel n-bit output pattern; and
selecting one of the number of multiple channel output patterns is based on a target output bit rate that is less than a bit rate corresponding to the single channel n-bit output pattern; and
providing the selected one of the single channel n-bit output pattern and the number of multiple channel output patterns to a receiver component.

10. The method of claim 9, further comprising starting the data patterns of the number of multiple channel output patterns at different locations within the single channel n-bit output pattern.

11. The method of claim 9, further comprising receiving the sub-patterns of the single channel n-bit output pattern from the PRBS generator.

12. The method of claim 9, further comprising coupling a memory device to an output of the channelization circuitry.

13. A system, comprising:
an n-bit parallel pseudo-random binary sequence (PRBS) generator; and channelization circuitry coupled to an output of the PRBS generator and configured to:
receive an n-bit pattern from the PRBS generator; and
selectively provide, at an output of the channelization circuitry, the n bits of the n-bit pattern received from the PRBS generator as a single channel n-bit output or as one of a number of multiple channel outputs with each one of the multiple channel outputs comprising n/m of the n bits, where "m" is a quantity of channels and is 2 or greater, wherein:
the number of multiple channel output patterns correspond to respective sub-patterns of the single channel n-bit output pattern;
each one of the multiple channel outputs is a sub-pattern of the n-bit pattern received from the PRBS generator; and
the sub-patterns of the n-bit pattern have different respective phase relationships.

14. The system of claim 13, wherein a first one of the multiple channel outputs comprises a sub-pattern corresponding to every odd bit of the n-bit pattern received from the PRBS generator, and second one of the multiple channel outputs comprises a sub-pattern corresponding to every even bit of the n-bit pattern received from the PRBS generator.

15. The system of claim 13, wherein the system comprises a memory device coupled to the output of the channelization circuitry.

16. The system of claim 15, wherein the memory device comprises a dynamic random-access memory (DRAM) device.

17. A system, comprising:
a memory component;
an n-bit parallel pseudo-random binary sequence (PRBS) generator coupled to channelization circuitry; and
a processing device, operatively coupled with the memory component, to:
control the channelization circuitry to select from among a single channel n-bit output pattern from the PRBS generator and a number of multiple channel output patterns from the PRBS generator, wherein:
the number of multiple channel output patterns correspond to respective sub-patterns of the single channel n-bit output pattern; and
the sub-patterns of the single channel n-bit output pattern have different respective phase relationships.

18. A system, comprising:
a memory component;
an n-bit parallel pseudo-random binary sequence (PRBS) generator coupled to channelization circuitry; and
a processing device, operatively coupled with the memory component, to:
control the channelization circuitry to select from among a single channel n-bit output pattern from the PRBS generator and a number of multiple channel output patterns from the PRBS generator, wherein:
the number of multiple channel output patterns correspond to respective sub-patterns of the single channel n-bit output pattern; and
one of the number of multiple channel output patterns comprises $2^m$ output channels, wherein "m" is 1 or greater, and wherein every $2^m$ bit of the n-bit output pattern is provided to a multiplexor for output at $n/(2^m)$ bits per phase, and wherein a quantity of phases corresponding to the $2^m$ output channels comprises $2^m$ phases.

* * * * *